United States Patent
Hikmet et al.

(10) Patent No.: US 7,459,220 B2
(45) Date of Patent: Dec. 2, 2008

(54) ELECTROLUMINESCENT PANEL

(75) Inventors: Rifat Ata Mustafa Hikmet, Eindhoven (NL); Henricus Albertus Maria Van Hal, Eindhoven (NL); Eliav Itzhak Haskal, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 72 days.

(21) Appl. No.: 10/513,749

(22) PCT Filed: Apr. 17, 2003

(86) PCT No.: PCT/IB03/01480

§ 371 (c)(1),
(2), (4) Date: Nov. 5, 2004

(87) PCT Pub. No.: WO03/096751

PCT Pub. Date: Nov. 20, 2003

(65) Prior Publication Data

US 2005/0238908 A1  Oct. 27, 2005

(30) Foreign Application Priority Data

May 10, 2002 (EP) .................................. 02076847

(51) Int. Cl.
*H01L 51/50* (2006.01)
(52) U.S. Cl. ..................... 428/690; 428/917; 313/504; 313/506
(58) Field of Classification Search ................ 428/690, 428/917, 76, 330; 313/512; 257/100; 252/181.7
See application file for complete search history.

(56) References Cited

U.S. PATENT DOCUMENTS

| | | | | |
|---|---|---|---|---|
| 4,318,734 A | * | 3/1982 | Scott et al. | 75/350 |
| 5,124,204 A | | 6/1992 | Yamashita et al. | |
| 5,312,607 A | * | 5/1994 | Schiabel et al. | 423/210 |
| 6,146,225 A | * | 11/2000 | Sheats et al. | 445/24 |
| 6,551,724 B2 | * | 4/2003 | Ishii et al. | 428/690 |
| 6,635,365 B2 | * | 10/2003 | Kawamura et al. | 428/690 |

FOREIGN PATENT DOCUMENTS

| | | | | |
|---|---|---|---|---|
| DE | 2651644 A | * | 6/1977 | |
| EP | 1014757 A | | 6/2000 | |
| EP | 1014758 A | | 6/2000 | |
| EP | 1079666 A | | 2/2001 | |
| JP | 1021070 A | | 7/2000 | |

* cited by examiner

*Primary Examiner*—Dawn Garrett

(57) ABSTRACT

An electroluminescent panel comprising: a closed casing; an organic device received in the casing and defining a plurality of pixels; the organic device including an organic luminescent layer between a lower and an upper electrode layer; and a getter means disposed in the casing. The getter means is a high capacity getter means by employing alkaline metals and/or alkaline earth metals in the form of non-oxidic compounds or alloys in which they are dispersed on a molecular scale, whereby they are still active reactants with oxygen, hydrogen and water. Preferably the getter means comprises a getter material selected from the following groups: (a) an alloy of at least one alkaline metal or alkaline earth metal with an other metal; (b) alkaline (earth) metal carbide, alkaline (earth) metal silicide, alkaline (earth) metal nitride; (c) at least one alkaline (earth) metal intercalated in C, Si, Ge, Sn or Pb.

5 Claims, 1 Drawing Sheet

ELECTROLUMINESCENT PANEL

The present invention relates to an electroluminescent panel comprising:
a closed casing;
an organic device received in the casing and defining a plurality of pixels; the organic device including an organic luminescent layer between a lower and an upper electrode layer; and
a getter means disposed in the casing.

U.S. Pat. No. 5,124,204 describes (in conjunction with FIG. 1) a conventional organic electroluminescent device which is prepared by forming on a glass base plate (2) a lower transparent electrode (4), an electroluminescent layer (3), an upper electrode (5) in this order. In order to prevent moisture from reaching the EL element, it is covered by a sealing plate (7) which is adhered to the glass base plate (2) by an adhesive (6), such as an epoxy resin. Underneath the sealing plate (7) moisture absorbing material (9) is placed.

In order to obtain a highly reliable organic electroluminescent device, a large quantity of moisture absorbing material should be present in order to be able to absorb moisture during the whole lifetime of the organic electroluminescent device. This is due to the fact that the device is not hermetically sealed as the epoxy glue is permeable to moisture and also other gases.

Various oxide substances such as phosphorus pentoxide ($P_2O_5$), alkaline metal oxide, alkaline earth metal oxide, have been suggested as water absorbing material.

The invention is based on the insight that alkaline metals and alkaline earth meals can work as high capacity moisture absorbers. Such materials work effectively only when they have a large surface area. Thus they need to be in the form of small particles. However when such particles have a large surface area they are not safe and cause explosions when they come in contact with air.

It is an object of the present invention to provide a new and improved organic electroluminescent panel which is provided with a high capacity alkaline (earth) metal based getter with reduced reactivity in air.

According to the invention an organic electroluminescent panel of the type described in the preamble is characterized in that the getter means includes a non-oxidic compound or alloy comprising at least one alkaline metal or alkaline earth metal element dispersed on a molecular scale whereby it is still an active reactant with oxygen, hydrogen and water. Preferred embodiments of the above the getter means comprise a getter material selected from the following groups:

a) an alloy of at least one alkaline metal or alkaline earth metal with an other metal;
b) alkaline (earth) metal carbide, alkaline (earth) metal silicide, alkaline (earth) metal nitride;
c) alkaline (earth) metal intercalated in C, Si, Ge, Sn or Pb.

By containing the inventive getter means, and in particular a getter material of one of the above groups, the inventive EL panel is significantly increased in lifetime, while the danger that the alkaline (earth) metal can react with air has been minimized. By the term "intercalation" is meant that the alkaline (earth) metal atoms are arranged between two atom layers of the other material.

According to a first embodiment to the getter material is in the form of particles, the particles preferably having a mean particle size of 0.01 to 10 micron. The particles may be packed e.g. in a permeable bag. This has the advantage that the getter can pick up the moisture or gases without the internal pressure in the casing increasing, or the getter material expanding. As an alternative the particles can be sintered to a porous structure, or dispersed in a plastic sheet which forms a porous matrix.

The inventive getter materials can be advantageously be used both in so-called permeable systems and in so-called hermetically sealed systems.

By the term permeable systems are meant electroluminescent panels of the type in which the organic device is separated from the outside world by a means which is permeable (to a certain extent) for gases like oxygen and hydrogen, and moisture. An example is e.g. a panel the casing of which comprises a first substrate which supports said organic device, a second substrate disposed above and spaced from said organic device, a (permeable) organic sealing means sealing a space between the first and second substrates at peripheral portions thereof.

By the term hermetically sealed systems are meant electroluminescent panels of the type the organic device is separated from the outside world by an impermeable seal, so that no gases or moisture can pass the seal, in either direction. An example is e.g. an encapsulated device in which the casing comprises a substrate which supports the organic device, an inorganic sealing layer positioned to form a laminated structure with said organic device and forming together with the substrate a hermetically sealed encapsulation for said organic device.

For acting as a moisture getter the getter is disposed in the casing out of contact with the organic device, However, in the case of hermetically sealed devices it may be necessary to trap gases such as oxygen and hydrogen which form during the operation of the devices in the organic (polymer) layer. By this trapping increase of the internal pressure is avoided. The moisture traps described here can also act as hydrogen and oxygen trap.

In order to be able to trap hydrogen and/or oxygen produced in the organic (polymer) layer, the getter should be in physical connection with the organic layer. By the term in physical connection is meant: in direct or indirect contact. Indirect contact means that the getter is separated from the organic layer by a gas permeable layer.

Accordingly, a further embodiment of the invention is characterized in that in a hermetically sealed system the getter material is located at a position in physical connection with the organic device.

In the framework of the invention alloys of at least one alkaline (earth) metal with Al have found to be very effective, in particular $Ba_4Al$.

Alkaline (earth) metal silicides, carbides and nitrides have also been found to be suitable. Alkaline (earth) metal hydrides however are not suitable. Calcium hydride e.g. picks up moisture according to the following reaction scheme:

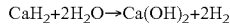

$$CaH_2 + 2H_2O \rightarrow Ca(OH)_2 + 2H_2$$

This means that hydrogen is generated together with water removal. This may lead to explosions, in particular in a large panel, e.g. if through a crack in the glass substrate or in the sealing a substantial amount of $H_2O$ enters the panel.

The invention also relates to a getter means as described above for general purposes.

These and other objects and features of the present invention will become clearer from the following description taken in conjunction with preferred embodiments thereof with reference to the accompanying drawings, in which.

Figure 1:
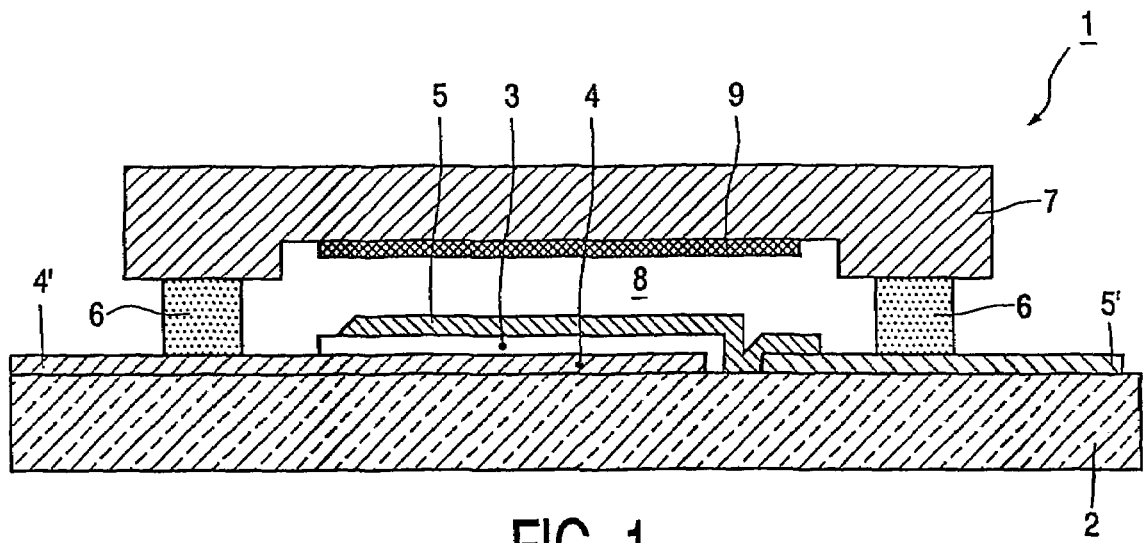
FIG. 1 is a schematic sectional view of a first type of electroluminescent panel.

FIG. 1 shows an electroluminescent (EL) display panel 1, comprising a glass substrate 2 on which several layers have been deposited by means of processes which are generally known in the art, such as physical or chemical vapor deposition, or ink-jet printing. The device 1 comprises an active or emissive layer 3 comprising an organic electroluminescent material, such as a coumarin (organic LED), or a conjugated polymer like PPV (poly(P-phenylene vinylene)) or a PPV-derivative (polymer LED), sandwiched between two patterns of electrode layers of an electrically conductive material. In this example, the electrode layers comprise column or data electrodes 4, which are deposited directly onto the glass substrate 2, and row or selection electrodes 5, thus forming a matrix of light emitting diodes (LED's). At least electrode 4 is made of a material, such as Indium Tin Oxide (ITO, that is transparent to the light emitted by the active layer 3. During operation, the column electrodes 4 are driven such that they are at a sufficient high positive voltage relative to the row electrodes 5, to inject holes in the active layer 3.

The stack of layers 3, 4 and 5 is contained in a cavity 8 which is formed by a sealing member or cover 7, which is secured to the glass substrate 2 by an adhesive 6, such as a thermosetting two-component epoxy resin. The sealed container formed by the glass substrate 2 and the cover 7 sealed onto the substrate 2 using the adhesive 6, is on the inside provided with a moisture absorption means, or getter, 9 such that the moisture absorbing material is spaced from the stack of layers 3, 4 and 5. For example, the moisture absorption means, or getter, 9 may be contained in a permeable bag attached to the cover 7 as depicted in FIG. 1.

In an example the getter material is $Ba_4Al$, in the form of particles having a mean size between 0.01 and 10 microns.

However, also the other inventive getter materials mentioned before are suitable.

The FIG. 1 panel is of the permeable type, as it has a sealing member, or cover, 7 which is secured to the glass substrate 2 by an adhesive 6. The sealing member 7 is not in physical contact with the organic device.

A second type of luminescent panel has a more compact construction, in which adjacent layers are in physical contact, there is no adhesive seam and no moisture getter (trap).

Figure 2:
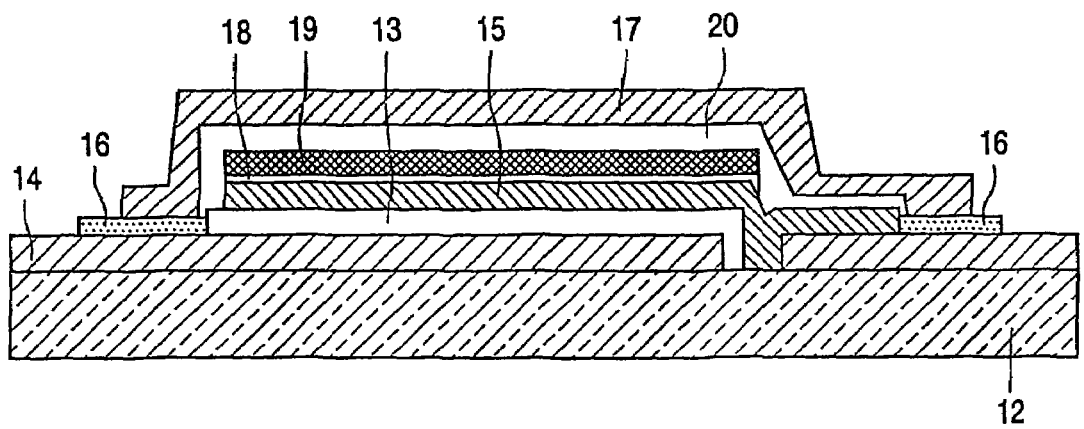
FIG. 2 is a schematic sectional view of a second type of electroluminescent panel.

FIG. 2 shows a cross-section of an example of a hermetically sealed electroluminescent panel of the layer stack (or: laminated) type. A substrate 12, which may be a glass substrate or e.g. a "passivated" plastic substrate carries a lower electrode layer 14, an organic (polymer) electroluminescent material layer 13 and an upper electrode layer 15, which together form the organic device. The layer stack 13, 14, 15 is completed by a sealing layer 17 of inorganic material, e.g. a carbide or a nitride, in particular silicon nitride, or an electrically insulating, moisture impermeable, metal oxide, which covers the organic device. Together with substrate 12, sealing layer 17 "encapsulates" the organic device. The resulting EL panel can be very thin. The organic electroluminescent layer 13 may comprise one, or a plurality of organic layers. In the following the expression "organic layer" will be used irrespective of the fact whether there is one or a plurality of organic layers.

However a problem with this approach is the production of hydrogen gas during the operation of the panel. The gas is produced mainly by the electrolysis of water remaining in the electroluminescent polymer. Some crosslinking reactions within the polymer can also lead to the formation of hydrogen gas within the system. As a result of gas production volume expansion and bursting and/or delamination of the stack can take place. Due to the hermetic encapsulation the gas cannot escape.

In order to solve this problem a hydrogen trap 19 is arranged inside the layer stack 13, 14, 15, 17, at a position in physical connection with the organic (polymer) layer 13.

In the FIG. 2 embodiment a hydrogen permeable layer 18 is arranged in a position where it is in physical contact with upper electrode 15 and in physical contact with hydrogen getter 19. Via pinholes in the electrode layer 15 and via the hydrogen permeable layer 18, hydrogen getter 19 is in physical connection with polymer layer 13. Accumulation of produced hydrogen at a single place in the getter layer is prevented by spreading the hydrogen over a large surface via the hydrogen permeable layer 18.

Layer 18 can be any material which is permeable to hydrogen gas. A very special example for layer 18 is a layer of palladium which is permeable to hydrogen but not to other gases. Other examples of such layer (it can also be combined with palladium) are inorganic oxides, nitrides, etc. (e.g. silicon oxide, aluminum oxide, silicon oxide). Usually during the sputtering or evaporation of these materials layers which are permeable to gases are obtained. Layer 18 can also be an organic material with a high glass transition temperature.

As a material for the inorganic sealing layer 17 a nitride, an oxynitride a metal-oxide or a metal may be used. It has been found that e.g. a defect free layer of Al can be vacuum deposited to a thickness in the range of 500-5000 å in order to produce a hermetic seal. In the FIG. 2 embodiment a metal sealing layer 17 is used. This necessitates the arrangement of an electrical isolation means 16 between the (metal) sealing layer 17 and the lower electrode layer 14 in order to prevent short circuiting. For the same purpose a layer 20 of electrically insulating material is deposited at least over the exposed portion of upper electrode 15 before inorganic sealing layer 17 is deposited. The electrical isolation materials used can be a low melting glass or a ceramic material.

Summarizing, the invention relates to an electroluminescent panel comprising:
 a closed casing;
 an organic device received in the casing and defining a plurality of pixels; the organic device including an organic luminescent layer between a lower and an upper electrode layer; and
 a getter means disposed in the casing.

The getter means is a high capacity getter means by employing alkaline metals and/or alkaline earth metals in the form of non-oxidic compounds or alloys in which they are dispersed on a molecular scale, whereby they are still active reactants with oxygen, hydrogen and water.

Preferably the getter means comprises a getter material selected from the following groups:
a) an alloy of at least one alkaline metal or alkaline earth metal with an other metal;
b) alkaline (earth) metal carbide, alkaline (earth) metal silicide, alkaline (earth) metal nitride;
c) at least one alkaline (earth) metal intercalated in C, Si, Ge, Sn or Pb.

The invention claimed is:
1. An electroluminescent panel comprising:
 a closed casing;
 an organic device received within the casing and defining a plurality of pixels; the organic device including an organic luminescent layer between a lower electrode layer and an upper electrode layer;
 a permeable layer formed directly on the upper electrode layer;
 a getter layer directly on the permeable layer, the getter layer comprising getter material selected from a first group or a second group, the first group including at least one of alkaline metal carbide, alkaline metal silicide, and alkaline earth metal nitride; and the second group including alkaline metal intercalated in at least one of C, Si, Ge and Sn;

a first insulator layer formed directly on the getter layer; and a metal sealing layer formed over the first insulator layer, wherein the first insulator layer prevents contact of the metal sealing layer with the upper electrode layer; and a second insulator layer formed over the lower electrode layer to prevent contact of the metal sealing layer with the lower electrode layer.

2. The electroluminescent panel of claim 1, wherein the getter material is in particulate form.

3. The electroluminescent panel of claim 2, wherein the getter material includes particles having a size of from 0.01 to 10 microns.

4. An electroluminescent panel comprising:

a closed casing;

an organic device within the casing defining a plurality of pixels; the organic device including an organic luminescent layer between a lower electrode layer and an upper electrode layer;

a getter layer comprising getter material selected from a first group or a second group, the first group including at least one of alkaline metal carbide, alkaline metal silicide, and alkaline earth metal nitride; and the second group including alkaline metal intercalated in at least one of C, Si, Ge and Sn; and a permeable layer formed directly on the upper electrode layer; the getter layer being directly on the permeable layer.

5. An electroluminescent panel comprising:

a closed casing;

an organic device within the casing defining a plurality of pixels; the organic device including an organic luminescent layer between a lower electrode layer and an upper electrode layer;

a getter layer comprising getter material selected from a first group or a second group, the first group including at least one of alkaline metal carbide, alkaline metal silicide, and alkaline earth metal nitride; and the second group including alkaline metal intercalated in at least one of C, Si, Ge and Sn;

a first insulator layer formed directly on the getter layer;

a metal sealing layer formed over the first insulator layer, wherein the first insulator layer prevents contact of the metal sealing layer with the upper electrode layer; and a second insulator layer formed over the lower electrode layer to prevent contact of the metal sealing layer with the lower electrode layer.

* * * * *